(12) United States Patent
Furukawa et al.

(10) Patent No.: US 7,084,060 B1
(45) Date of Patent: Aug. 1, 2006

(54) FORMING CAPPING LAYER OVER METAL WIRE STRUCTURE USING SELECTIVE ATOMIC LAYER DEPOSITION

(75) Inventors: Toshiharu Furukawa, Essex Junction, VT (US); Steven J. Holmes, Guilderland, NY (US); David V. Horak, Essex Junction, VT (US); Charles W. Koburger, III, Delmar, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/908,244

(22) Filed: May 4, 2005

(51) Int. Cl.
*H01L 21/44* (2006.01)

(52) U.S. Cl. .................. 438/677; 438/643; 438/902; 257/751

(58) Field of Classification Search ............. 438/902, 438/677, 643; 257/677, 751
See application file for complete search history.

(56) References Cited

U.S. PATENT DOCUMENTS

| | | | |
|---|---|---|---|
| 5,035,782 | A | 7/1991 | Tamura et al. |
| 5,286,571 | A | 2/1994 | Mirkin et al. |
| 6,333,260 | B1 | 12/2001 | Kwon et al. |
| 6,518,167 | B1* | 2/2003 | You et al. .................. 438/622 |
| 6,528,409 | B1* | 3/2003 | Lopatin et al. ............. 438/618 |
| 6,716,693 | B1 | 4/2004 | Chan et al. |
| 6,764,940 | B1 | 7/2004 | Rozbicki et al. |
| 6,794,755 | B1 | 9/2004 | Maiz et al. |
| 6,844,258 | B1 | 1/2005 | Fair et al. |
| 2004/0126482 | A1* | 7/2004 | Wu et al. .................. 427/58 |
| 2004/0137721 | A1* | 7/2004 | Lim et al. .................. 438/638 |
| 2004/0214425 | A1* | 10/2004 | Lin et al. .................. 438/629 |
| 2004/0253826 | A1* | 12/2004 | Ivanov et al. .............. 438/710 |
| 2005/0009325 | A1* | 1/2005 | Chung et al. ............... 438/637 |
| 2005/0260339 | A1* | 11/2005 | Cheng et al. .............. 427/97.9 |

OTHER PUBLICATIONS

Marcinko, S. et al., "Hydrolytic Stability of Organic Monolayers Supported on $TiO_2$ and $ZrO_2$," Langmuir 2004, 20, pp. 2270-2273.

Nakanishi, T. et al., "Site-Selective Deposition of Magnetite Particulate Thin Films on Patterned Self-Assembled Monolayers," Chem. Mater. 2004, 16, pp. 3484-3488.

(Continued)

*Primary Examiner*—Matthew Smith
*Assistant Examiner*—John M. Parker
(74) *Attorney, Agent, or Firm*—Lisa U. Jaklitsch; Hoffman, Warnick & D'Alessandro LLC

(57) ABSTRACT

Methods of forming a capping layer over a metal wire structure of a semiconductor device are disclosed. In one embodiment, the method includes providing a partially fabricated semiconductor device having exposed surfaces of the metal (e.g., copper) wire structure and a dielectric around the metal wire structure. The exposed surface of the metal wire structure is then activated by forming a seed layer thereon. The capping layer is then formed over the exposed surface of the metal wire structure by performing a selective atomic layer deposition (ALD) of a capping layer material onto the metal wire structure. As an alternative, the dielectric may be masked off to further assist the selectivity of the ALD. The invention also includes a semiconductor structure including the metal wire structure having an atomic layer deposition capping layer over an upper surface thereof.

16 Claims, 3 Drawing Sheets

OTHER PUBLICATIONS

Park, M. H. et al., "Selective Atomic Layer Deposition of Titanium Oxide on Patterned Self-Assembled Monolayers Formed by Microcontact Printing," Langmuir 2004, 20, pp. 2257-2260.

Afsin, B. et al., "Reaction Pathways in the Oxydehydrogenation of Ammonia at Cu(110) Surfaces," Surface Science, vol. 284, 1993, pp. 109-120.

Van de Kerkhof, G.J.C.S. et al., "Dissociation of Ammonia on a Copper Surface and the Effect of Oxygen Coadsorption: A Quantum-Chemical Study," Surface Science, vol. 284, 1993, pp. 361-371.

Guo, X. et al., "Site-Specific Reactivity of Oxygen at Cu(100) Step Defects: an STM Study of Ammonia Dehydrogenation," Surface Science, vol. 367, 1996, pp. L95-L101.

Becker, J. S. et al., "Highly Conformal Thin Films of Tungsten Nitride Prepared by Atomic Layer Deposition from a Novel Precursor," Chem. Mater. 2003, 15, pp. 2969-2976.

Becker, J. S. et al., "Atomic Layer Deposition of Insulating Hafnium and Zirconium Nitrides," Chem. Mater. 2004, 16, pp. 3497-3501.

Smith, S. et al., "Physical and Electrical Characterization of ALCVD™ TiN and $WN_xC_y$ Used as a Copper Diffusion Barrier in Dual Damascene Backend Structures (08.2)," Microelectronic Engineering, vol. 64, 2002, pp. 247-253.

Leskelä, M. et al., "Atomic Layer Deposition (ALD): From Precursors to Thin Film Structures," Thin Solid Films, vol. 409, 2002, pp. 138-146.

* cited by examiner

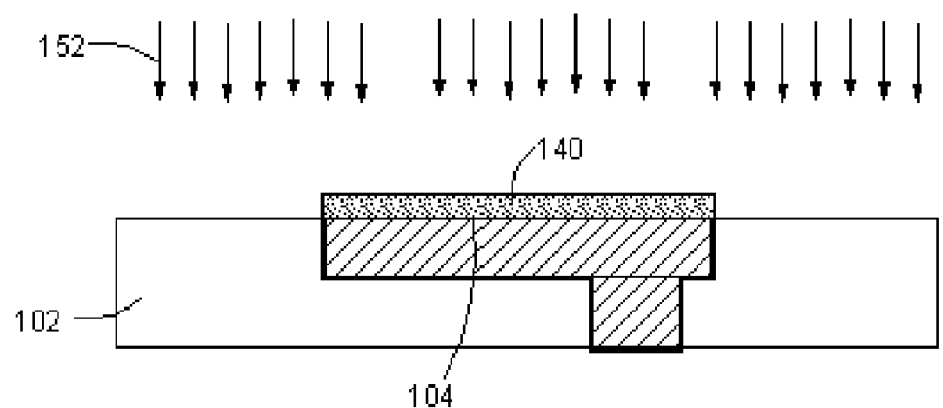

FORMING CAPPING LAYER OVER METAL WIRE STRUCTURE USING SELECTIVE ATOMIC LAYER DEPOSITION

BACKGROUND OF THE INVENTION

1. Technical Field

The present invention relates generally to semiconductor fabrication, and more particularly, to forming a capping layer over a metal wire structure in a partially fabricated semiconductor device using selective atomic layer deposition.

2. Related Art

Metal migration is the diffusion of molecules of a metal conductor (such as copper or aluminum) into surrounding dielectric such as silicon dioxide or polymers from exposure to high temperatures, which ultimately leads to current leakage and device failure. Electromigration is the movement of atoms of a metal conductor in response to the passage of high current through it, which can lead to the formation of "voids" in the conductor that can grow to a size where the conductor is unable to pass current. Typically, metal migration and electromigration have been addressed by providing liners about metal conductors; these liners hinder or forestall these effects.

One challenge with providing liners is generating a liner or capping layer on the upper surface of a metal wire structure. In particular, metal wires are typically formed by a Damascene process in which a metal wire's pattern is first lithographically defined in a layer of dielectric, and then a metal is deposited to fill resulting trenches. Excess metal is then removed by means of chemical-mechanical polishing (planarization), which leaves an upper surface of the metal exposed, i.e., with no capping layer and no means of preventing metal migration or electromigration. One approach to generating a capping layer on a copper line is disclosed in U.S. Pat. No. 6,844,258 to Fair et al. In this approach, a refractory metal nucleation layer is deposited and then at least the upper portion of the refractory metal layer is nitrided to form a refractory metal nitride. One shortcoming of this approach, however, is that it is fairly complicated.

In view of the foregoing, there is a need in the art for methods of forming a capping layer over a metal wire structure that do not suffer from the problems of the related art.

SUMMARY OF THE INVENTION

The invention includes methods of forming a capping layer over a copper structure of a semiconductor device. In one embodiment, the method includes providing a partially fabricated semiconductor device having exposed surfaces of the metal (e.g., copper) wire structure and a dielectric around the metal wire structure. The exposed surface of the metal wire structure is then activated by forming a seed layer thereon. The capping layer is then formed over the exposed surface of the metal wire structure by performing a selective atomic layer deposition (ALD) of a capping layer material onto the metal wire structure. As an alternative, the dielectric may be masked off to further assist the selectivity of the ALD. The invention also includes a semiconductor structure including the metal wire structure having an atomic layer deposition capping layer over an upper surface thereof.

A first aspect of the invention is directed to a method of forming a capping layer over a metal wire structure of a semiconductor device, the method comprising the steps of: providing a partially fabricated semiconductor device having exposed surfaces of the metal wire structure and a dielectric around the metal wire structure; activating the exposed surface of the metal wire structure by forming a seed layer thereon by reacting the metal wire structure with at least one of the following: a) ammonia, b) an ammonia/oxygen mixture and c) at least one of the following reactive organic compounds: an amine, a thiol, a phosphine and an acetylene; and forming the capping layer over the metal wire structure by performing a selective atomic layer deposition of a capping layer material onto the metal wire structure.

A second aspect of the invention includes a method of forming a capping layer over a copper structure of a semiconductor device, the method comprising the steps of: providing a partially fabricated semiconductor device having exposed surfaces of the copper structure and a dielectric around the copper structure; masking the dielectric by exposing the partially fabricated semiconductor device to a reagent to form a self-assembled monolayer of hydrophobic, inert masking layer over the dielectric, the reagent including at least one of the following: alkyl-trichloro-silane, alkyl-dichlorophoshine, alkyl-triethoxysilane, alkyl-phosphonate, dialkyl-chlorosilane, dialkyl-ethoxy silane, dialkyl-chlorophosphine, diakyl-phosphonate, trialkyl-chlorosilane, trialkyl-ethoxy silane, trialkyl-chlorophoshine, trialkyl-phosphonate, tert-butyl, adamantyl, n-butyl, isopropyl, neopentyl, methyl, ethyl, n-propyl, phenyl, and alkyl-phenyl; activating the exposed surface of the metal wire structure by reacting the metal wire structure with at least one of the following: a) ammonia, b) an ammonia/oxygen mixture and c) at least one of the following reactive organic compounds: an amine, a thiol, a phosphine and an acetylene, to create a seed layer; and forming the capping layer over the copper structure by performing a selective atomic layer deposition of a capping layer material onto the copper structure.

A third aspect of the invention related to a semiconductor structure comprising: a metal wire structure, the metal wire structure having an atomic layer deposition capping layer over an upper surface thereof.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein:

FIG. 5 shows removal of the masking layer and the semiconductor structure formed according to the invention.

DETAILED DESCRIPTION

Figure 1:
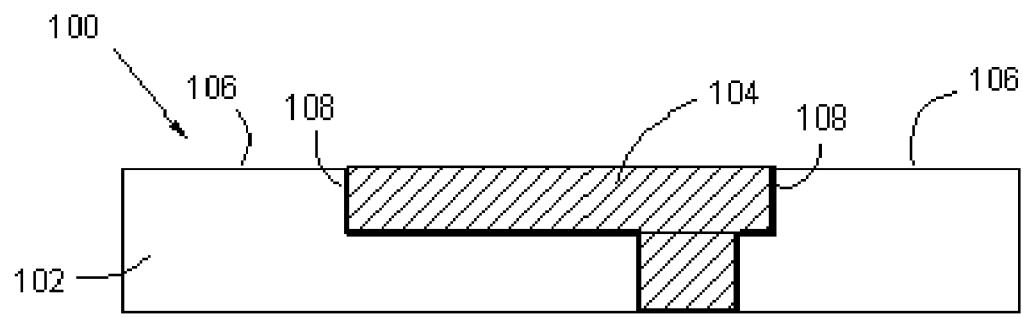
FIG. 1 shows a partially fabricated semiconductor device according to the invention.

With reference to the accompanying drawings, FIG. 1 shows a first step of one embodiment of a method of forming a capping layer over a metal wire structure of a semiconductor device. As shown in FIG. 1, a partially fabricated semiconductor device 100 is provided. Device 100 has been processed up through a wiring mask level, dielectric etch, liner deposition, metal fill in a dielectric 102, and chemical mechanical polishing (CMP) to planarize a metal wire structure 104. At this point, device 100 includes exposed surfaces of metal wire structure 104 and an exposed surface 106 of dielectric 102 that extends around metal wire structure 104. Liners 108 may be provided about metal wire structure 104, and also have upper surfaces thereof exposed at this point. Metal wire structure 104 may include copper (Cu), aluminum (Al) or other metal conductor(s). In one preferred embodiment, however, metal wire structure 104 includes copper (Cu). Dielectric 102 may include a silicon dioxide ($SiO_2$), fluorinated silicon dioxide ($FSiO_2$), or hydrogenated silicon oxycarbide (SiCOH) type dielectric material. Dielectric 102 could also include an organic dielectric or an organic dielectric with a hard mask on top, such as silicon dioxide ($SiO_2$), silicon oxynitride ($SiO_xN_y$) or silicon nitride ($Si_3N_4$).

Figure 2:
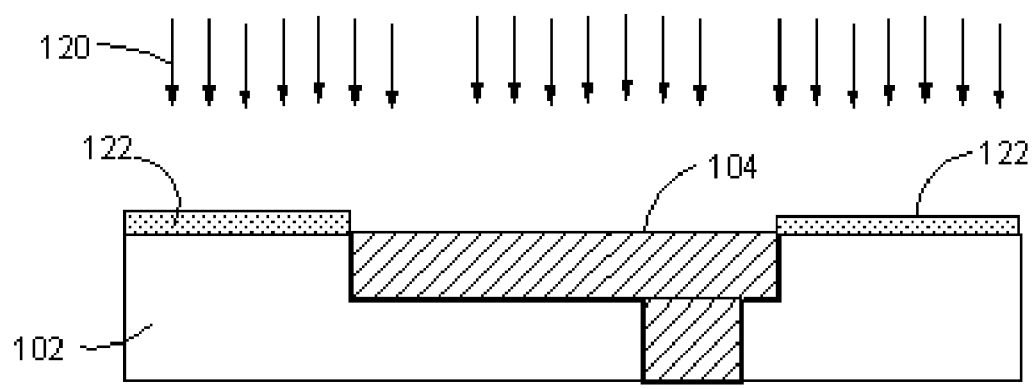
FIG. 2 shows an optional step of forming a masking layer according to one embodiment of a method of the invention.

FIG. 2 shows an optional second step including masking exposed surface 106 (FIG. 1) of dielectric 102 by exposing the surface to a reagent 120 to form a self-assembled monolayer of hydrophobic, inert masking layer 122 over dielectric 102. Reagent 120 can be in a solvent solution or vapor form, depending on the type of reagent used. Reagent 120 may include at least one of the following: alkyl-trichloro-silane, alkyl-dichlorophoshine, alkyl-triethoxysilane, alkyl-phosphonate, dialkyl-chlorosilane, dialkyl-ethoxy silane, dialkyl-chlorophosphine, diakyl-phosphonate, trialkyl-chlorosilane, trialkyl-ethoxy silane, trialkyl-chlorophosphine, trialkyl-phosphonate, tert-butyl, adamantyl, n-butyl, isopropyl, neopentyl, methyl, ethyl, n-propyl, phenyl, and alkyl-phenyl. Exposure to reagent 120 results in chemical binding of the silicon or phosphorus reagent selective to hydroxyl groups of dielectric 102, i.e., in the form of silicon dioxide ($SiO_2$). The alkyl group is chosen to be large and bulky (such as tert-butyl, adamanthyl, n-butyl, isopropyl, neopentyl, or other less bulky alkyl groups could also be used, such as methyl, ethyl, n-propyl, phenyl and alkylphenyl), to provide a hydrophobic nature to the dielectric surface and to block the reactivity of the dielectric surface with atomic layer deposition (ALD) reagents that will be used to form the capping layer over metal wire structure 104. The reaction of reagent 120 (i.e., the silicon and phosphorus agents) is selective, such that dielectric 102 is coated with a uniform monolayer of reagent, while metal wire structure 104 remains exposed to the ambient. After treating with reagent 120, dielectric 102 is annealed at, for example, approximately 100 to approximately 300° C. At higher temperatures selectivity may be enhanced due to thermal degradation of any residual masking materials bound to copper (Cu). The choice of temperature depends on the reactive species; a higher temperature also serves to decompose any solvent reagent that might react with the copper surface. It should be reiterated that while the rest of the method will be illustrated with masking layer 122 present, this step is optional.

Figure 3:
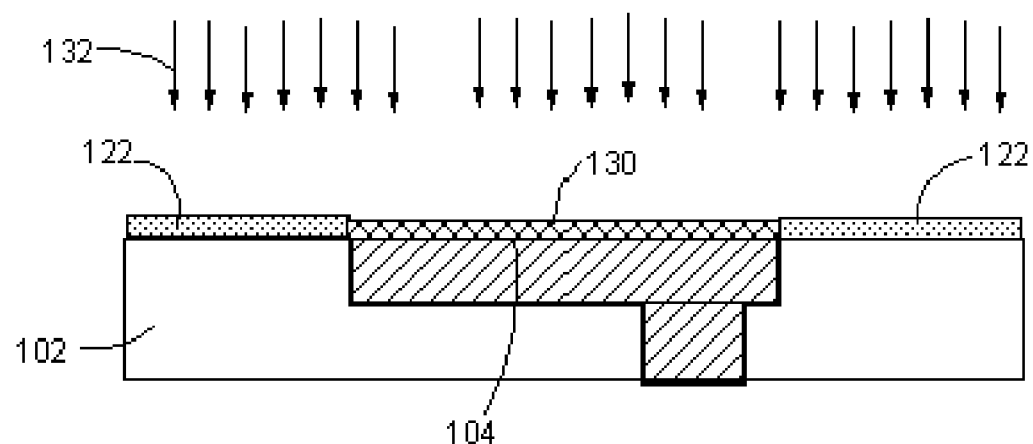
FIG. 3 shows formation of a seed layer according to one embodiment of a method of the invention.

Turning to FIG. 3, a next step includes activating the exposed surface of metal wire structure 104 by forming a seed layer 130 thereon. In one embodiment, this step includes reacting metal wire structure 104 with one of ammonia ($NH_3$) and an ammonia/oxygen ($NH_3/O_2$) mixture 132 to create seed layer 130 including a metal wire species on the exposed surface of metal wire structure 104. In particular, metal wire structure 104 in the form of copper can be activated for ALD with ammonia or ammonia/oxygen mixtures. Alternatively, metal wire structure 104 may be activated by reacting it with at least one of the following reactive organic compounds: an amine, a thiol, a phosphine and an acetylene. In one preferred embodiment, the amine groups serve to act as an initial binding layer for the metal wire species, such as metal amides. Alternatively, activation could also be implemented using one or more amines to activate the copper surface, such as mono-alkyl amines (e.g., methyl amine, ethyl amine, propyl amine, tert-butyl amine, hydroxyl-amine, sulfhydrylamine ($NH_2SH$)), amino alcohols, amino thiols, ethylenediamine and similar materials. A reactive organic compound including: a thiol, a phosphine or an acetylene, or a combination thereof (possibly including an amine), may also work to form seed layer 130.

Figure 4:
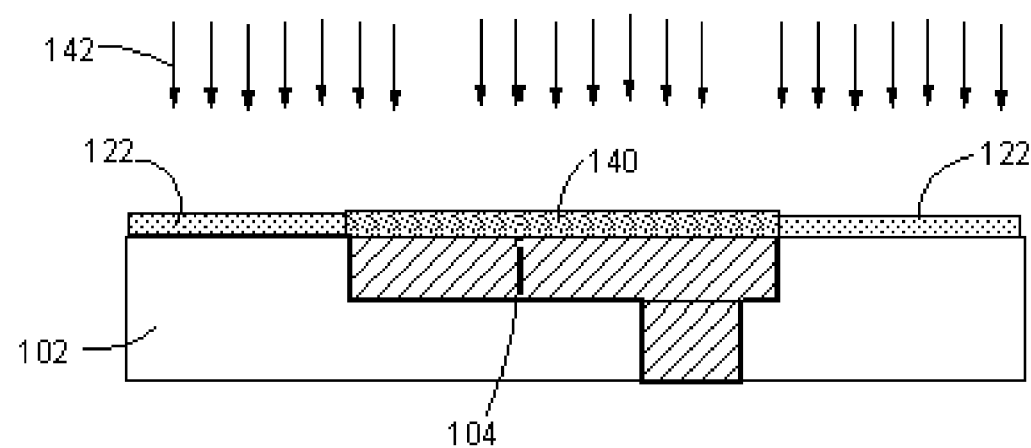
FIG. 4 shows formation of a capping layer according to one embodiment of a method of the invention.

Turning to FIG. 4, the next step includes forming capping layer 140 over metal wire structure 104 by performing a selective atomic layer deposition 142 of a capping layer material onto metal wire structure 104. The capping layer material may include at least one conductive material such as: tungsten nitride (WN), titanium nitride (TiN), tantalum nitride (TaN), tantalum (Ta), titanium (Ti), tungsten (W). Alternatively, the capping layer material may include at least one insulative material such as: zirconium nitride (ZrN), hafnium nitride (HfN) and aluminum nitride (AlN). In one embodiment, capping layer 140 has a thickness of no greater than approximately 200 Å. In one embodiment, the ALD process can be performed, using alternating cycles of a metal precursor and ammonia ($NH_3$), for example, to form metal nitride, or a metal precursor and hydrogen ($H_2$), to form metal material. The process is selective because of amine seed layer 130 on metal wire structure 104 and (optionally) masking layer 122. The resulting capping layer 140 prevents metal migration and electromigration, and stabilizes a boundary layer between metal wire structure 104 and layers to be formed thereover.

FIG. 5 shows another step including removing the hydrophobic, inert masking layer 122, when provided. In one embodiment, this step can be carried out, for example, with a brief argon (Ar) sputter or a reactive ion etch (RIE) 152.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of forming a capping layer over a metal wire structure of a semiconductor device, the method comprising the steps of:
    providing a partially fabricated semiconductor device having exposed surfaces of the metal wire structure and a dielectric around the metal wire structure;
    activating the exposed surface of the metal wire structure by forming a seed layer thereon by reacting the metal wire structure with at least one of the following: a) ammonia, b) an ammonia/oxygen mixture and c) at least one of the following reactive organic compounds: an amine, a thiol, a phosphine and an acetylene;
    masking the exposed surface of the dielectric by exposing the dielectric to a reagent to form a self-assembled monolayer of hydrophobic, inert masking layer over the dielectric; and
    forming the capping layer over the metal wire structure by performing a selective atomic layer deposition of a capping layer material onto the metal wire structure.

2. The method of claim 1, wherein the reagent includes at least one of the following: alkyl-trichloro-silane, alkyl-dichlorophoshine, alkyl-triethoxysilane, alkyl-phosphonate, dialkyl-chlorosilane, dialkyl-ethoxy silane, dialkyl-chlorophosphine, diakyl-phosphonate, trialkyl-chlorosilane, trialkyl-ethoxy silane, trialkyl-chlorophosphine, trialkyl-phosphonate, tert-butyl, adamantyl, n-butyl, isopropyl, neopentyl, methyl, ethyl, n-propyl, phenyl, and alkyl-phenyl.

3. The method of claim 1, further comprising the step of removing the hydrophobic, inert masking layer after the capping layer forming step.

4. The method of claim 1, wherein the metal wire structure includes copper (Cu).

5. The method of claim 4, wherein in the case that the seed layer includes an amine, the amine includes at least one of the following: methyl amine, ethyl amine, propyl amine, tert-butyl amine, hydroxyl-amine, sulfhydrylamine ($NH_2SH$), amino alcohols, amino thiols, and ethylenediamine.

6. The method of claim 1, wherein the capping layer material includes at least one of tungsten nitride (WN), titanium nitride (TiN), tantalum nitride (TaN), tantalum (Ta), titanium (TI) and tungsten (W).

7. The method of claim 1, wherein the capping layer material includes at least one of zirconium nitride (ZrN), hafnium nitride (HfN) and aluminum nitride (AlN).

8. The method of claim 1, wherein the capping layer forming step includes performing alternating cycles of a metal precursor and one of: ammonia ($NH_3$) to form metal nitride and hydrogen ($H_2$) to form metal material.

9. The method of claim 1, wherein the capping layer has a thickness of no greater than approximately 200 Å.

10. A method of forming a capping layer over a copper structure of a semiconductor device, the method comprising the steps of:
   providing a partially fabricated semiconductor device having exposed surfaces of the copper structure and a dielectric around the copper structure;
   masking the dielectric by exposing the partially fabricated semiconductor device to a reagent to form a self-assembled monolayer of hydrophobic, inert masking layer over the dielectric, the reagent including at least one of the following: alkyl-trichloro-silane, alkyl-dichlorophoshine, alkyl-triethoxysilane, alkyl-phosphonate, dialkyl-chlorosilane, dialkyl-ethoxy silane, dialkyl-chlorophosphine, diakyl-phosphonate, trialkyl-chlorosilane, trialkyl-ethoxy silane, trialkyl-chlorophosphine, trialkyl-phosphonate, tert-butyl, adamantyl, n-butyl, isopropyl, neopentyl, methyl, ethyl, n-propyl, phenyl, and alkyl-phenyl;
   activating the exposed surface of the metal wire structure by reacting the metal wire structure with at least one of the following: a) ammonia, b) an ammonia/oxygen mixture and c) at least one of the following reactive organic compounds: an amine, a thiol, a phosphine and an acetylene, to create a seed layer; and
   forming the capping layer over the copper structure by performing a selective atomic layer deposition of a capping layer material onto the copper structure.

11. The method of claim 10, further comprising the step of removing the hydrophobic, inert masking layer after the capping layer forming step.

12. The method of claim 10, wherein in the case that the seed layer includes an amine, the amine includes at least one of the following: methyl amine, ethyl amine, propyl amine, tert-butyl amine, hydroxyl-amine, sulfhydrylamine ($NH_2SH$), amino alcohols, amino thiols, and ethylenediamine.

13. The method of claim 10, wherein the capping layer material includes at least one of tungsten nitride (WN), titanium nitride (TiN), tantalum nitride (TaN), tantalum (Ta), titanium (Ti) and tungsten (W).

14. The method of claim 10, wherein the capping layer material includes at least one of zirconium nitride (ZrN), hafnium nitride (HfN) and aluminum nitride (AlN).

15. The method of claim 10, wherein the capping layer forming step includes performing alternating cycles of a metal precursor and one of: ammonia ($NH_3$) to form metal nitride and hydrogen ($H_2$) to form metal material.

16. The method of claim 10, wherein the capping layer has a thickness of no greater than approximately 200 Å.

* * * * *